1,035,447 B2

(12) United States Patent
Dugal et al.

(10) Patent No.: US 9,035,447 B2
(45) Date of Patent: May 19, 2015

(54) POWER SEMICONDUCTOR MODULE AND POWER SEMICONDUCTOR MODULE ASSEMBLY WITH MULTIPLE POWER SEMICONDUCTOR MODULES

(71) Applicant: ABB Technology AG, Zürich (CH)

(72) Inventors: Franc Dugal, Zollikon (CH); Dominik Trüssel, Bremgarten (CH)

(73) Assignee: ABB TECHNOLOGY AG, Zurich (CH)

( * ) Notice: Subject to any disclaimer, the term of this patent is extended or adjusted under 35 U.S.C. 154(b) by 0 days.

(21) Appl. No.: 14/257,397

(22) Filed: Apr. 21, 2014

(65) Prior Publication Data

US 2014/0225245 A1    Aug. 14, 2014

Related U.S. Application Data

(63) Continuation of application No. PCT/EP2012/070621, filed on Oct. 18, 2012.

(30) Foreign Application Priority Data

Oct. 21, 2011    (EP) .................................... 11186101

(51) Int. Cl.
*H01L 23/48*    (2006.01)
*H01L 23/492*    (2006.01)
(Continued)

(52) U.S. Cl.
CPC ............ *H01L 23/492* (2013.01); *H01L 23/051* (2013.01); *H01L 23/62* (2013.01); *H01L 24/72* (2013.01); *H01L 25/072* (2013.01); *H01L 2924/13055* (2013.01); *H01L 23/585* (2013.01)

(58) Field of Classification Search
USPC .......................... 257/688, 691, 704, 718, 719
See application file for complete search history.

(56) References Cited

U.S. PATENT DOCUMENTS 3,192,454 A * 6/1965 Kursawe et al. ............... 257/727
4,950,554 A   8/1990 Fusco
(Continued)

FOREIGN PATENT DOCUMENTS

DE   195 30 264 A1   3/1997
EP   1 209 742 A1    5/2002
(Continued)

OTHER PUBLICATIONS

International Search Report (PCT/ISA/210) mailed on Nov. 30, 2012, by the European Patent Office as the International Searching Authority for International Application No. PCT/EP2012/070621.
(Continued)

*Primary Examiner* — S. V. Clark
(74) *Attorney, Agent, or Firm* — Buchanan Ingersoll & Rooney PC (57) ABSTRACT

A power semiconductor module and a power semiconductor module assembly, which includes a plurality of power semiconductor modules, are disclosed. The power semiconductor module includes an electrically conducting base plate, an electrically conducting top plate, arranged in parallel to the base plate and spaced apart from the base plate, at least one power semiconductor device, which is arranged on the base plate in a space formed between the base plate and the top plate, and at least one presspin, which is arranged in the space formed between the base plate and the top plate to provide contact between the semiconductor device and the top plate. A metallic protection plate can be provided at an inner face of the top plate facing towards the base plate, wherein the material of the protection plate has a melting temperature higher than the melting temperature of the top plate.

20 Claims, 4 Drawing Sheets

(51) Int. Cl.
*H01L 23/051* (2006.01)
*H01L 23/62* (2006.01)
*H01L 23/00* (2006.01)
*H01L 25/07* (2006.01)
*H01L 23/58* (2006.01)

(56) References Cited

U.S. PATENT DOCUMENTS

| | | | |
|---|---|---|---|
| 5,705,873 | A | 1/1998 | Sato |
| 6,303,974 | B1 | 10/2001 | Irons et al. |
| 6,373,129 | B1 * | 4/2002 | Yamazaki et al. ............ 257/688 |
| 6,654,250 | B1 * | 11/2003 | Alcoe ............................ 361/719 |
| 7,196,530 | B2 * | 3/2007 | Haseyama et al. ....... 324/755.09 |
| 2002/0060371 | A1 | 5/2002 | Lang |
| 2002/0074640 | A1 * | 6/2002 | Gamboa ....................... 257/690 |
| 2004/0207070 | A1 | 10/2004 | Kaufmann et al. |
| 2005/0230789 | A1 * | 10/2005 | Manabe et al. ............... 257/666 |
| 2010/0230804 | A1 * | 9/2010 | Kise .............................. 257/712 |

FOREIGN PATENT DOCUMENTS

| | | |
|---|---|---|
| EP | 1 263 045 A1 | 12/2002 |
| EP | 1 475 832 A1 | 11/2004 |
| GB | 2 332 092 A | 6/1999 |
| JP | 9-275186 A | 10/1997 |

OTHER PUBLICATIONS

European Search Report issued on May 4, 2012.
Notification Concerning Transmittal of International Preliminary Report on Patentability (Forms PCT/IB/326 and PCT/IB/373) and the Written Opinion of the International Searching Authority (Form PCT/ISA/237) issued May 1, 2014 by the International Bureau of WIPO in corresponding International Application No. PCT/EP2012/070621. (10 pages).

* cited by examiner

POWER SEMICONDUCTOR MODULE AND POWER SEMICONDUCTOR MODULE ASSEMBLY WITH MULTIPLE POWER SEMICONDUCTOR MODULES

RELATED APPLICATION(S)

This application claims priority as a continuation application under 35 U.S.C. §120 to PCT/EP2012/070621, which was filed as an International Application on Oct. 18, 2012, designating the U.S., and which claims priority to European Application No. 11186101.9 filed on Oct. 21, 2011. The entire content of these applications are hereby incorporated by reference in their entireties.

FIELD

The present disclosure relates to a power semiconductor module including an electrically conducting base plate, an electrically conducting top plate, arranged in parallel to the base plate and spaced apart from the base plate, at least one power semiconductor device, which is arranged on the base plate in a space formed between the base plate and the top plate, and at least one presspin, which is arranged in the space formed between the base plate and the top plate to provide contact between the power semiconductor device and the top plate. The present disclosure also relates to a power semiconductor module assembly including multiple or a plurality of power semiconductor modules.

BACKGROUND INFORMATION

Power semiconductors devices can deal with voltages of about 1.7 kV or higher. The semiconductor device and the base plate, which can be made of molybdenum or an alloy based on molybdenum, can be in surface contact to allow conduction of electricity and heat transfer away from the semiconductor, for example, the semiconductor device is thermally and electrically coupled to the base plate. Power semiconductor devices used in this area can be power transistors, for example, insulated gate bipolar transistors (IGBT), reverse conducting insulated gate bipolar transistors (reverse conducting IGBT), bi-mode insulated gate transistors (BIGT) or (power) diodes.

Power semiconductor devices can be combined for forming power semiconductor modules, which can deal with currents of up to 100 A or more. The power semiconductor devices can be arranged in parallel on a common base plate, which can form an electrically conducting base of the power semiconductor module. The power semiconductor module can be covered by an electrically conducting top plate, which can be a lid of a housing of the power semiconductor module. The top plate can provide a further contact for the power semiconductor devices. The power semiconductor modules can include identical power semiconductor devices, for example, power transistors, or different power semiconductor devices, for example, a set of power transistors and at least one power diode. The power semiconductor devices can be connected to the electrically conducting top plate by means of the presspins. In case of power transistors used in the power semiconductor modules, the control contacts can be connected to the lid by means of presspins, wherein the top plate can be electrically isolated from the control contacts.

Multiple power semiconductor modules can be combined to form a power semiconductor module assembly. The power semiconductor modules can be arranged mechanically and electrically in parallel to each other in a common housing. The base plates of the power semiconductor modules can form an electrically conducting base of the power semiconductor module assembly. Additionally, the housing of the power semiconductor module assembly can be covered by an electrically conducting lid, which can be in contact with the lids of the power semiconductor modules arranged therein. In an embodiment of the power semiconductor module assembly, the lid of the assembly can be a common lid for the multiple power semiconductor modules therein. The power semiconductor module assembly can include identical power semiconductor modules, for example, power semiconductor modules including power transistors and power diodes as described above, or different power semiconductor modules, for example, a set of power semiconductor modules including power transistors and at least one power semiconductor module including power diodes. Such power semiconductor module assemblies are, for example, known as "Stakpak" from the applicant and can be used for forming stacked arrangements as used for example in HVDC applications, which deal with up to several hundred kV. Accordingly, the mechanical design of the power semiconductor module assembly can be enhanced (e.g., optimized) in order to facilitate clamping in long stacks. In these stacked arrangements, mechanical and electrical stability of a single power semiconductor module assembly is desired to help prevent failures of the entire stacked arrangement.

Instead of arranging the power semiconductor modules in power semiconductor module assemblies and stacking of the power semiconductor module assemblies, the power semiconductor modules can also be stacked directly.

In a stacked arrangement of power semiconductor modules or power semiconductor module assemblies, a cooler can be provided between neighbouring power semiconductor modules or power semiconductor module assemblies. The coolers can use water as heat transfer medium for cooling the stacked arrangements of power semiconductor modules or power semiconductor module assemblies. The coolers can be relatively expensive to replace.

In the context of stacked arrangements, support of a short circuit failure mode (SCFM) of the individual power semiconductor devices can be a feature. In case one of the power semiconductor devices fails, the device can fail by providing a short circuit to enable conduction from the base plate to the lid, which can disable the power semiconductor device in SCFM. The same can also refer to the power semiconductor module assemblies including the failing power semiconductor module. When multiple of the power semiconductor modules or the power semiconductor module assemblies can be connected in series, for example, forming the above-mentioned stacked arrangement, failure of a single power semiconductor device does not lead to a failure of the stacked arrangement as a whole.

In this short circuit failure mode, currents of up to 2000 A can flow through a single power semiconductor device and the respective press pin in contact with the failing power semiconductor device, since the short circuit bridges all parallel power semiconductor devices. To achieve a high life time of these power semiconductor devices and accordingly a high life time of the power semiconductor modules and the power semiconductor module assemblies, it is desired that the short circuit failure mode can be maintained for a year or even more. In power semiconductor module assemblies, failure of a single power semiconductor module is not critical, since a neighbouring power semiconductor module can provide electrical connection between the two contacts of the assembly. Accordingly, internal damage of a power semiconductor module can be tolerated within a power semiconductor module assembly, even when all pins of a single module are consumed due to arcing.

Arcing within the power semiconductor device can also involve the top plate or lid. A top plate of a power semiconductor device can be made of copper, which can provide a good conductivity and can be produced at reasonable costs. Since the arcs can cause temperatures high enough to melt the top plate, the top plate underlies wearing and oxidation and can be even destroyed. For example, in a power semiconductor module assembly, when the top plate of a power semiconductor module is destroyed, the lid of the power semiconductor module assembly can also be affected by the arcing and thereby be destroyed. Accordingly, a failure of a single power semiconductor module can propagate to neighboring power semiconductor modules and can cause failure of the entire power semiconductor module. Furthermore, in a stacked arrangement of power semiconductor modules or power semiconductor module assemblies, the cooler between in contact with the top plate or the lid can also be affected by the arcing. For example, when the cooler is destroyed, water leakage can occur and cause further failures. Water leakage in electrical installations can also be a general safety problem, especially taking into account the high voltages and currents involved.

SUMMARY

A power semiconductor module is disclosed comprising: an electrically conducting base plate; an electrically conducting top plate, which is arranged in parallel to the base plate and spaced apart from the base plate; at least one power semiconductor device, which is arranged on the base plate in a space formed between the base plate and the top plate; at least one presspin, which is arranged in the space formed between the base plate and the top plate and configured to provide contact between the at least one power semiconductor device and the top plate; and a metallic protection plate provided at an inner face of the top plate facing towards the base plate, wherein a material of the protection plate has a melting temperature higher than a melting temperature of the top plate.

A power semiconductor module assembly is disclosed, having a plurality of power semiconductor modules, each of the plurality of power semiconductor comprising: an electrically conducting base plate; an electrically conducting top plate, which is arranged in parallel to the base plate and spaced apart from the base plate; at least one power semiconductor device, which is arranged on the base plate in a space formed between the base plate and the top plate; at least one presspin, which is arranged in the space formed between the base plate and the top plate, and configured to provide contact between the at least one power semiconductor device and the top plate; and a metallic protection plate provided at an inner face of the top plate facing towards the base plate, wherein a material of the protection plate has a melting temperature higher than a melting temperature of the top plate; and wherein the plurality of power semiconductor modules are arranged side by side to each other with electric connections between adjacent power semiconductor modules.

BRIEF DESCRIPTION OF THE DRAWINGS

The disclosure is explained below with reference to the exemplary embodiments shown in the drawings. In the drawings.

DETAILED DESCRIPTION

The present disclosure provides a power semiconductor module and a power semiconductor module assembly, which can be resistant to electrical arcing, and which can increase safety of stacked arrangements and which can be available at a relatively lower cost.

A power semiconductor module is disclosed, which can include an electrically conducting base plate, and an electrically conducting top plate, which can be arranged in parallel to the base plate and spaced apart from the base plate, at least one power semiconductor device, which can be arranged on the base plate in a space formed between the base plate and the top plate, and at least one presspin, which can be arranged in the space formed between the base plate and the top plate to provide contact between the power semiconductor device and the top plate, wherein a metallic protection plate is provided at an inner face of the top plate facing towards the base plate, wherein the material of the protection plate has a melting temperature higher than the melting temperature of the top plate.

A power semiconductor module assembly is disclosed, which includes multiple power semiconductor modules as specified above, wherein the power semiconductor modules are arranged side by side to each other with electric connections between adjacent power semiconductor modules.

In accordance with an exemplary embodiment, the electrical arcs can be trapped between the base plate and the protection plate, such that the electrical arcs do not reach the top plate. Thus, the top plate can be protected from the electrical arcs for an increased life time of the top plate. For example, the protection plate can be protected from melting due to the high temperatures caused by arcing, so that the top plate is not subject to melting. The metal of the protection plate dissipates heat, which is further conducted by the protection plate and the top plate without affecting the integrity of the top plate. The term metal can also include alloys, which have characteristics similar to metals. The top plate can be made of copper or other suitable materials, which can be relatively inexpensive, and only the protection plate can be made of a metal having an increased melting temperature compared to the top plate. The base plate can be a base plate made of molybdenum or other suitable materials, which can be used for conducting heat and electricity and providing mechanical integrity of the power semiconductor module. The material of the protection plate can also have a low electron emission, so the occurrence of electrical arcs can be reduced.

In an exemplary embodiment, the material of the protection plate can include molybdenum. In an exemplary embodiment of the present disclosure, the material of the base plate can be an alloy including molybdenum and copper. These materials have a melting temperature higher than the melting temperature of a copper alone, which can be a material for the top plate. The electron emission of the protection plate can be lower than the electron emission of a top plate made of copper. For example, the use of alloys including molybdenum and copper can reduce costs compared to a protection plate made of pure molybdenum.

In an exemplary embodiment, the material of the protection plate can include tungsten. Tungsten can have a high melting temperature and low electron emission rate compared to copper.

In an exemplary embodiment, the material of the top plate can include aluminium or an alloy including aluminium.

In an exemplary embodiment, the material of the protection plate can include nickel, chrome or an alloy thereof.

In an exemplary embodiment, the protection plate can cover the surface of the top plate in the area of a head of the at least one presspin. For example, the protection plate can be provided to cover the top plate around the head of the presspin, and the head of the at least one press pin can be in contact with the protection plate, which provides electrical contact with the top plate. Since arcing can originate from the presspins, the area of the top plate around the presspin can frequently be affected by arcing. Areas of the top plate can be without coverage by the protection plate, for example, in areas where arcing does not frequently occur. In a power semiconductor device including multiple presspins, multiple individual protection plates can be provided. For example, a single protection plate can be provided for a power semiconductor module, which can simplify the mounting of the power semiconductor module. For example, the protection plate can extend over essentially the entire surface of the top plate to provide a uniform protection of the top plate. In accordance with an exemplary embodiment, areas of the top plate can be spared, for example, when arcing does not occur in these areas or presspins are to be electrically isolated from each other. In accordance with the design of the top plate, the protection plate can be provided with electrically isolated regions depending on the kind electrical contact made by the presspin. For example, if the power semiconductor device is a power transistor, the gate of the power transistor can be contacted by a presspin, which can be isolated from the protection plate and the top plate. In contrast, those presspins, which are in contact with the top side of the power transistor, the emitter or collector, for example, the emitter of the power transistor, can be in direct electrical contact with the protection plate or the top plate.

In an exemplary embodiment, the protection plate can be provided with at least one gap which is positioned to surround the head of the at least one presspin. The surface of the top plate can be covered by the protection plate around the head of the presspin. For example, if the power transistors are being used as power semiconductor devices, the presspin can be in contact with either the gate or the emitter/collector, as described above. The protection plate can have gaps to surround only the head of a presspin contacting a gate contact, whereas the head of a presspin contacting the emitter/collector can be in direct electrical contact with the protection plate.

In an exemplary embodiment, the protection plate can be provided integral with the head of the at least one presspin. Accordingly, electrical contact from the presspin to the protection plate can be improved. For example, in case of the power semiconductor devices being power transistors, only the head of the presspins in contact with the emitter/collector will be provided integral with the protection plate, to maintain electrical isolation between gate and the emitter/collector.

In an exemplary embodiment, the at least one presspin can have an inverse structure with its shaft fixed to its head and its foot moveable along its shaft. Accordingly, the foot can be provided with an annular hole or through hole, which can surround the shaft. The protection plate can provide a common head for multiple presspins, wherein the shaft can be fixed directly to the protection plate. The shaft can be fixed to the protection plate by means of any suitable connection type, for example, soldering or others. The protection plate can be provided with a hole for receiving an end region of the shaft. For example, the hole can be a through hole. Furthermore, the hole and the end region of the shaft can be provided with a corresponding thread to facilitate mounting of the shaft to the protection plate. Additional soldering or other connection techniques can be used.

In an exemplary embodiment, the at least one power semiconductor device can be an insulated gate bipolar transistor, a reverse conducting insulated gate bipolar transistor, a bi-mode insulated gate transistor, or a diode. The power semiconductor devices can be suitable for being operated in high power conditions and can deal with high voltages and currents. For example, multiple identical power semiconductor devices can be combined in a single power semiconductor module. Alternatively, an arbitrary set of power semiconductor devices from the listed power semiconductor devices can be combined in a single power semiconductor module. In case of a diode, the anode and cathode can be referred to as a first and second contact. In case of power transistors, the emitter and collector can be referred to as a first and second contact, and the gate as a control contact.

According to an exemplary embodiment, the power semiconductor module can include a housing, wherein the top plate forms a top side of the housing and can provide a first contact of the power semiconductor module, the base plate forms a base of the housing and can provide a second contact of the power semiconductor module. The top plate can provide a common first contact of the power semiconductor module for contacting the first contacts of the power semiconductor devices, and the base plate can provide a second contact of the power semiconductor module for contacting the second contacts of the power semiconductor devices. The first and second contact of the power semiconductor module can be contacted by other power semiconductor modules in the case of a stacked arrangement or by respective contacts of a power semiconductor module assembly. In the case of power transistors, for example, IGBTs, the first contact can refer to an emitter contact, the second contact can refer the collector contact, and the control contact can refer to a gate contact. In accordance with an exemplary embodiment, the control contact, which is not in electric contact with the lid of the power semiconductor module, can be contacted, for example, through a gap in the lid or by a lateral contact element of the power semiconductor module.

According to an exemplary embodiment of the power semiconductor module assembly of the disclosure, the base plates of the power semiconductor modules can be electrically connected to each other. The connection can be made by wiring or by providing a contact plate for contacting the base plates and/or the lids of the semiconductor modules.

According to an exemplary embodiment of the power semiconductor module assembly of the disclosure, the power semiconductor module assembly can include a housing, wherein an electrically conducting lid can form a top side of the housing and can provide a first contact of the power semiconductor module assembly, which can be in contact with the first contacts of the power semiconductor modules, and the base plates of the power semiconductor modules extend through a base of the housing. The first and second contacts of the power semiconductor module assembly can be contacted by other power semiconductor module assemblies in the case of a stacked arrangement. For example, the lid of the power semiconductor module assembly can provide a first contact for contacting the first contacts of the power semiconductor modules, and the base plates of the power semiconductor modules can provide a common second contact of the power semiconductor modules. In case the power semiconductor modules have control contacts, the control contacts can also be electrically connected within the power semiconductor module assembly. The power semiconductor module assembly can have a lateral contact for contacting the connected control contacts of the power semiconductor modules, or the connected control contacts of the power semiconductor modules can be contacted through a gap in the lid. The first and second contact of the power semiconductor module assembly can be contacted by other power semiconductor module assemblies in the case of a stacked arrangement. In the case of power transistors like IGBTs, the first contact refers to an emitter contact, the second contact can refer to a collector contact, and the control contact can refer to a gate contact.

Figure 1:
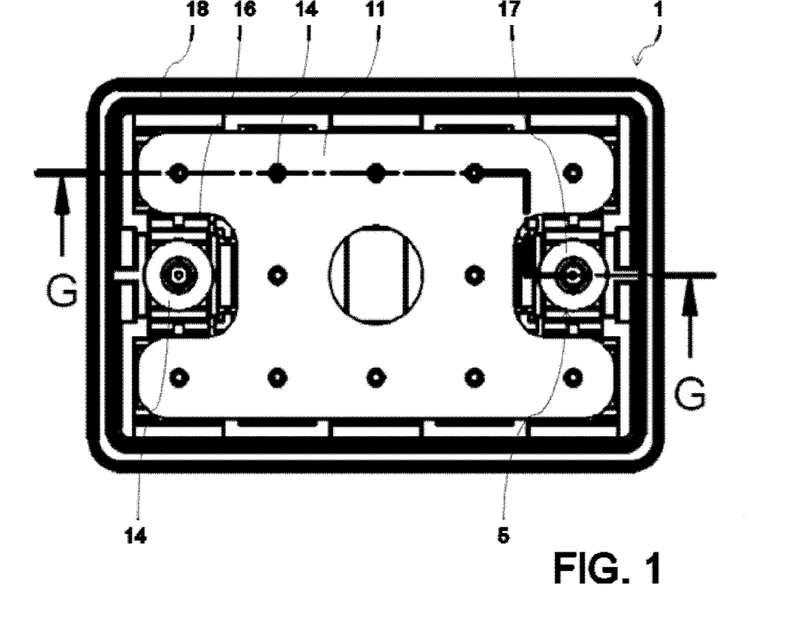
FIG. 1 shows a top view of an exemplary power semiconductor module according to the present disclosure with removed top plate.
Figure 2:
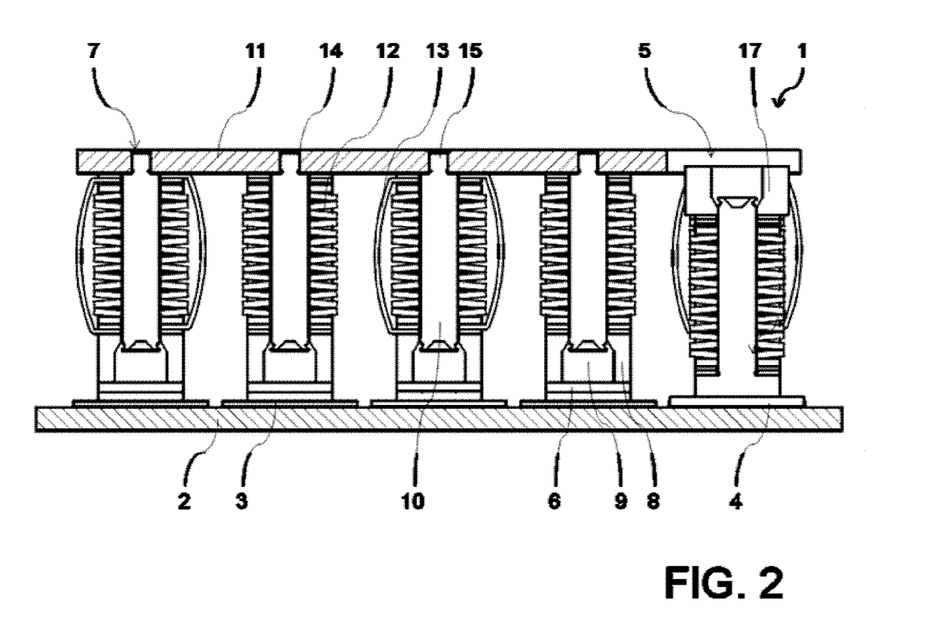
FIG. 2 shows a sectional view along the line G-G of the power semiconductor module shown in FIG. 1.
Figure 3:
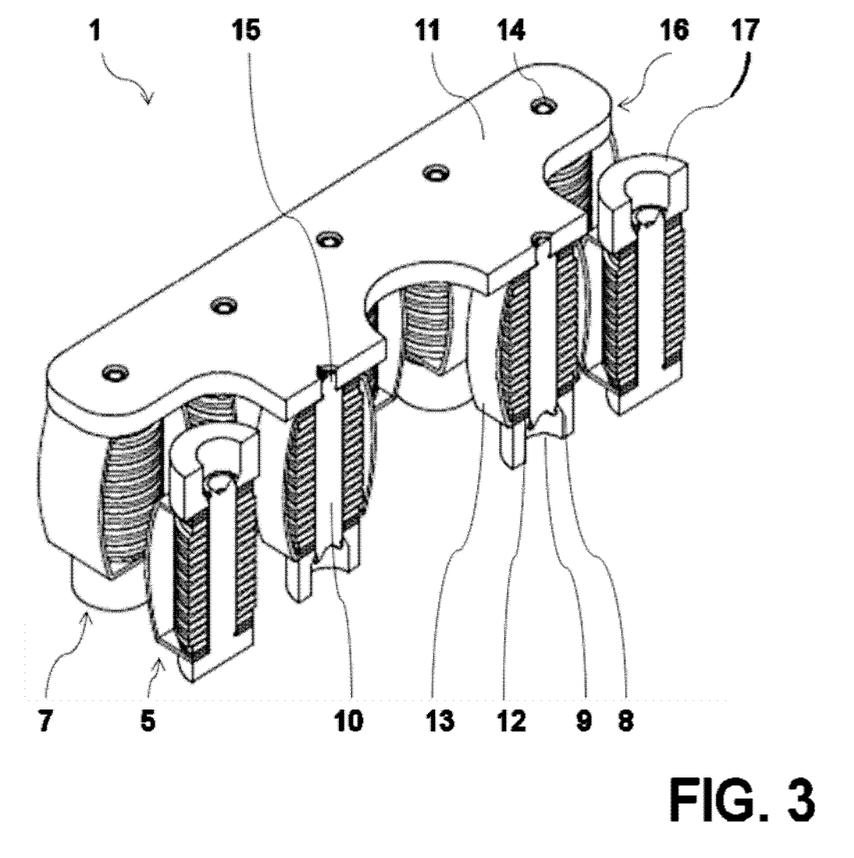
FIG. 3 shows a perspective cross-sectional view of the protection plate and press pins of the power semiconductor module of FIG. 1.
Figure 4:
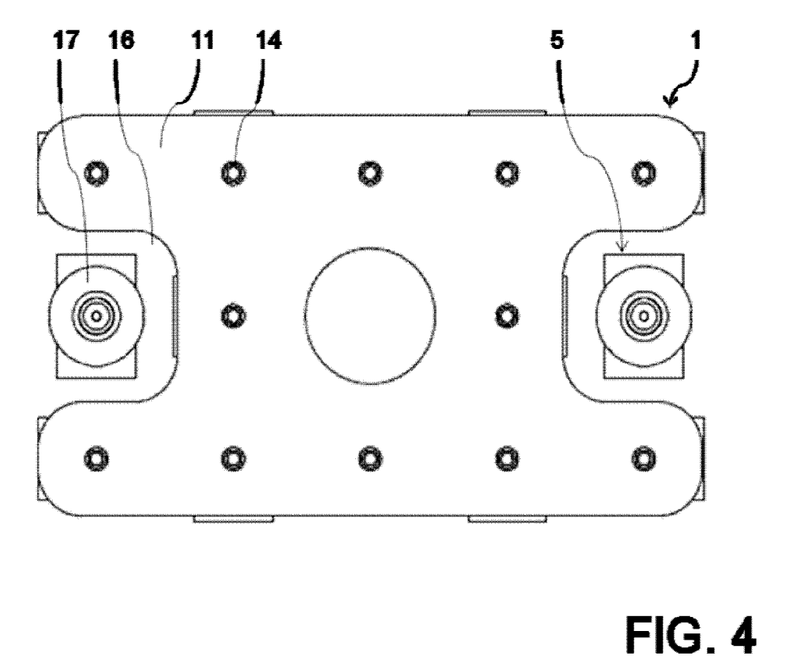
FIG. 4 shows the top view of the power semiconductor module of FIG. 1 without its housing.
Figure 5:
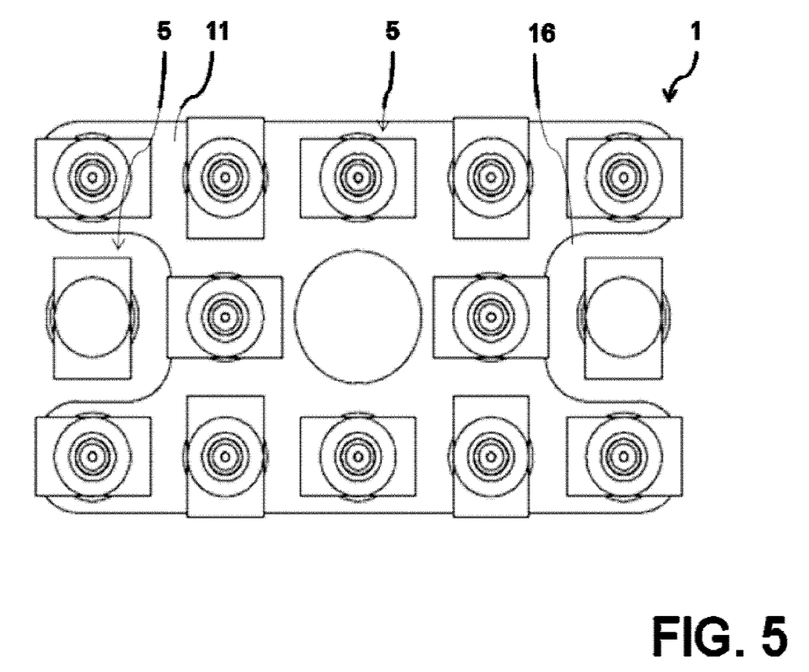
FIG. 5 shows a bottom view of the arrangement of FIG. 4.

FIG. 1 shows a top view of an exemplary power semiconductor module 1 according to the present disclosure. The power semiconductor module 1 can include, as shown in FIGS. 2 and 3 as well as in FIG. 6, a base plate 2 and multiple power semiconductor devices 3. The power semiconductor devices 3 can be power transistors, for example, GBTs and power diodes, which can be arranged on the base plate 2. The power semiconductor devices 3 can be on their bottom face in surface contact with the base plate 2 to provide mechanical connection as well as electrical and thermal conductivity therebetween. For the IGBTs, gate runners 4 can be provided on the base plate 2. Gate runners 4 can be electric contact plates isolated from the base plate 2 and connected to the gates of the IGBTs.

The gate runner 4 can be contacted by a first presspin 5, also referred to as a gate pin, which is a presspin known in the art and therefore not described in detail. The power semiconductor devices 3 can be further contacted on their top face via an intermediate contact element 6, which is here shown as two-layer contact element 6, by second presspins 7, which can also be referred to as chip pins. The chip pins 7 can have an essentially inverse structure compared to the gate pins 5 and include a foot 8 with a through hole 9 and a shaft 10, which can be moveable within the through hole 9. A protection plate 11 can integrally form a common head of the chip pins 7. The chip pins 7 can further include the spring washer pack 12, which can be arranged around the shaft 10 between the protection plate 11 and the foot 8 for exerting an outwardly directed force on the protection plate 11 and the foot 8, and a current bypass 13, which can electrically connect the foot 8 and the protection plate 11.

For mounting the chip pins 7, the protection plate 11 can be provided with several through holes 14, in which an upper end region 15 of the shaft 10 can be received. The through holes 14 and the upper end regions 15 of the shafts 10 can be provided with a corresponding thread, so that the shafts 10 can be fixed to the protection plate 11 by means of a thread connection. In an exemplary embodiment, the shafts 10 can be press-fitted into the through holes 14.

Figure 6:
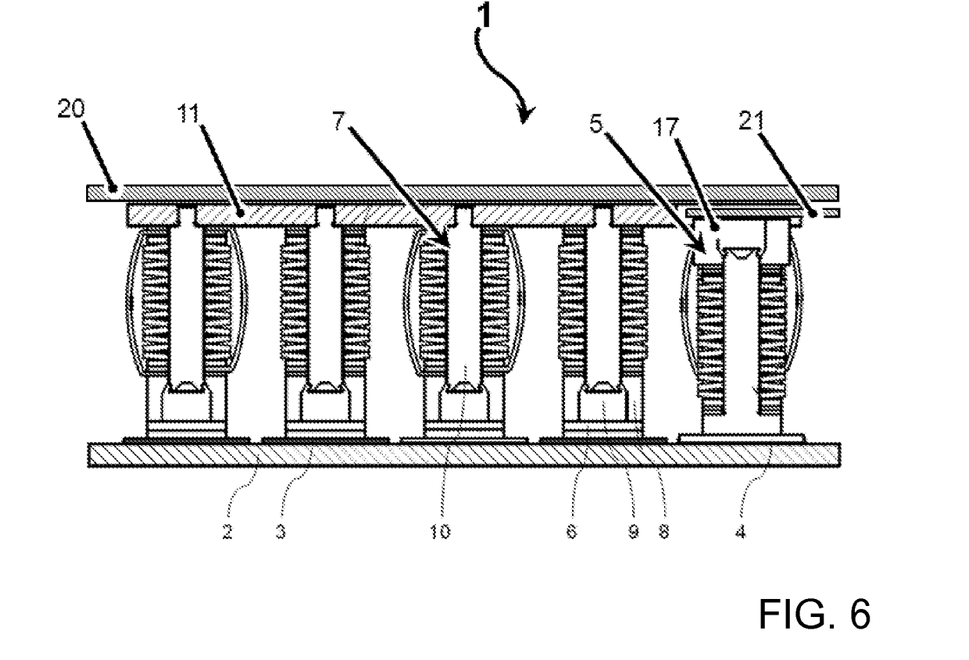
FIG. 6 shows a sectional view along the line G-G of the power semiconductor module shown in FIG. 1 with the top plate.

The protection plate 11 and the base plate 2 can be made of molybdenum. The protection plate 11 can be provided below a top plate 20, which is shown in FIG. 6, and covers the inner face of the top plate 20. The protection plate 11 can be in electrical contact with the top plate 20. The protection plate 11 can be provided with a number of gaps 16, which surround heads 17 of the gate pins 5. The gate pins 5 with their heads 17 can be in mechanical contact with the top plate 20, wherein isolation means can be provided between the head 17 and the top plate.

The power semiconductor module 1 can include a housing 18, wherein the base plate 2 forms a base of the housing 18. The electrically conducting top plate 20 can form a top side of the housing 18. The top plate can provide a first contact of the power semiconductor module 1 and the base plate 2 provides a second contact of the power semiconductor module 1. The power semiconductor devices 3 can be in mechanical and electrical contact with the top plate by means of the presspins 5, 7 and, for example, in case of the chip pins 7, the protection plate 11, wherein the gate pins 5 can be electrically isolated from the top plate 20. The base plate 2 can be connected to the collectors, for example, second contacts of the power semiconductor devices 3 and can form a second contact of the power semiconductor module 1, and the emitters, for example, first contacts of the power semiconductor devices 3 can be connected to the top plate. The gates of the power semiconductor devices 3 can be commonly contacted in the power semiconductor module 1 through a gap in the top plate or can be provided by a gate conductor 21 provided at the top plate 20 and insulated from it on the side towards the base plate 2.

A power semiconductor module assembly, which is not explicitly shown in the figures, can include multiple power semiconductor modules 1 as described above. The power semiconductor modules 1 can be arranged side by side to each other within a housing, wherein the base plates 2 of the power semiconductor modules 1 can extend through a base of the housing. An electrically conducting lid can form a top side of the housing and can provide a common contact for the power semiconductor modules 1 with electric connections between adjacent power semiconductor modules 1. The lid can provide a first contact of the power semiconductor module assembly for contacting the first contacts of the power semiconductor modules 1 and the base plates 2 commonly provide a second contact of the power semiconductor module assembly. The lid of the power semiconductor module assembly can form a common lid or a common top plate 20 for the modules arranged in the assembly. The control contacts of the power semiconductor modules 1 can be connected to each other within the power semiconductor module assembly and to a lateral electric contact of the power semiconductor module assembly.

The power semiconductor modules 1 as well as the power semiconductor module assemblies can be stacked, with coolers arranged between neighboring power semiconductor modules 1 or power semiconductor module assemblies.

While the disclosure has been illustrated and described in detail in the drawings and foregoing description, such illustration and description are to be considered illustrative or exemplary and not restrictive; the disclosure is not limited to the disclosed embodiments. Other variations to be disclosed embodiments can be understood and effected by those skilled in the art in practicing the claimed disclosure, from a study of the drawings, the disclosure, and the appended claims. In the claims, the word "including" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCE SIGNS LIST 1 power semiconductor module
2 base plate
3 power semiconductor device
4 gate runner
5 first presspin, gate pin
6 contact element
7 second presspin, chip pin
8 foot
9 through hole
10 shaft
11 protection plate
12 spring washer pack
13 current bypass
14 through hole
15 upper end region
16 gap
17 head
18 housing
20 top plate, lid
21 gate conductor

What is claimed is:

1. A power semiconductor module comprising:
an electrically conducting base plate;
an electrically conducting top plate, which is arranged in parallel to the base plate and spaced apart from the base plate;
at least one power semiconductor device, which is arranged on the base plate in a space formed between the base plate and the top plate;
at least one presspin, which is arranged in the space formed between the base plate and the top plate and configured to provide contact between the at least one power semiconductor device and the top plate; and
a metallic protection plate provided at an inner face of the top plate facing towards the base plate, wherein a material of the protection plate has a melting temperature higher than a melting temperature of the top plate.

2. The power semiconductor module according to claim 1, wherein the material of the protection plate comprises: molybdenum.

3. The power semiconductor module according to claim 1, wherein the material of the protection plate is an alloy comprising:
molybdenum and copper.

4. The power semiconductor module according to claim 1, wherein the material of the protection plate comprises: tungsten.

5. The power semiconductor module according to claim 1, wherein the protection plate is configured to cover a surface of the top plate in an area of a head of the at least one presspin.

6. The power semiconductor module according to claim 1, comprising:
at least one gap in the protection plate, which is configured to surround a head of the at least one presspin.

7. The power semiconductor module according to claim 1, wherein the protection plate is configured to be integral with a head of the at least one presspin.

8. The power semiconductor module according to claim 7, wherein the least one presspin comprises:
a shaft fixed to the head; and
a foot movable along the shaft of the at least one presspin.

9. The power semiconductor module according to claim 1, wherein the at least one power semiconductor device is one of an insulated gate bipolar transistor, a reverse conducting insulated gate bipolar transistor, a bi-mode insulated gate transistor, or a diode.

10. The power semiconductor module according to claim 1, comprising:
a housing, wherein the top plate is configured to form a top side of the housing and provide a first contact of the power semiconductor module, and the base plate is configured to form a base of the housing and provide a second contact of the power semiconductor module.

11. The power semiconductor module according to claim 1, configured to provide a short circuit failure mode, which is supported by the power semiconductor module.

12. A power semiconductor module assembly, having a plurality of power semiconductor modules, each of the plurality of power semiconductor comprising:
an electrically conducting base plate;
an electrically conducting top plate, which is arranged in parallel to the base plate and spaced apart from the base plate;
at least one power semiconductor device, which is arranged on the base plate in a space formed between the base plate and the top plate;
at least one presspin, which is arranged in the space formed between the base plate and the top plate, and configured to provide contact between the at least one power semiconductor device and the top plate; and
a metallic protection plate provided at an inner face of the top plate facing towards the base plate, wherein a material of the protection plate has a melting temperature higher than a melting temperature of the top plate; and
wherein the plurality of power semiconductor modules are arranged side by side to each other with electric connections between adjacent power semiconductor modules.

13. The power semiconductor module assembly according to claim 12, wherein the base plates of the power semiconductor modules are configured to be electrically connected to each other.

14. The power semiconductor module assembly according to claim 13, comprising:
a housing including an electrically conducting lid, which is configured to form a top side of the housing and provide a first contact of the power semiconductor module assembly, which is in contact with the first contacts of the power semiconductor modules, and the base plates of the power semiconductor modules are configured to extend through a base of the housing.

15. The power semiconductor module assembly according to claim 12, wherein the material of the each of the protection plates comprises:
one of molybdenum, an alloy containing molybdenum and copper, or tungsten.

16. The power semiconductor module assembly according to claim 12, wherein each of the protection plates is configured to cover a surface of the top plate in an area of a head of the at least one presspin of the semiconductor module.

17. The power semiconductor module assembly according to claim 12, comprising:

at least one gap in each protection plate, which is configured to surround a head of the at least one presspin of the semiconductor module.

18. The power semiconductor module assembly according to claim 12, wherein each protection plate is configured to be integral with a head of the at least one presspin of the semiconductor module.

19. The power semiconductor module assembly according to claim 18, wherein each presspin comprises:
 a shaft fixed to the head and a foot movable along the shaft of the at least one presspin.

20. The power semiconductor module assembly according to claim 12, wherein power semiconductor device is one of an insulated gate bipolar transistor, a reverse conducting insulated gate bipolar transistor, a bi-mode insulated gate transistor, or a diode.

* * * * *